US007530166B2

(12) United States Patent
Mehdizadeh

(10) Patent No.: US 7,530,166 B2
(45) Date of Patent: May 12, 2009

(54) METHOD FOR MAKING A RADIO FREQUENCY COUPLING STRUCTURE

(75) Inventor: Mehrdad Mehdizadeh, Avondale, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 82 days.

(21) Appl. No.: 11/661,899

(22) PCT Filed: Aug. 31, 2005

(86) PCT No.: PCT/US2005/031128

§ 371 (c)(1), (2), (4) Date: Mar. 1, 2007

(87) PCT Pub. No.: WO2006/047006

PCT Pub. Date: May 4, 2006

(65) Prior Publication Data

US 2007/0294879 A1 Dec. 27, 2007

Related U.S. Application Data

(60) Provisional application No. 60/607,182, filed on Sep. 2, 2004.

(51) Int. Cl.
*H05K 3/02* (2006.01)
*H05K 3/34* (2006.01)

(52) U.S. Cl. ............................ 29/846; 29/840; 29/847; 340/572.7

(58) Field of Classification Search .................. 29/600, 29/602, 592.1, 825, 829; 340/572.7, 572.8; 343/789, 700 MS
See application file for complete search history.

(56) References Cited

U.S. PATENT DOCUMENTS 5,404,145 A 4/1995 Sa et al.
5,528,222 A 6/1996 Moskowitz
5,844,523 A 12/1998 Brennan et al.
6,018,299 A * 1/2000 Eberhardt ................ 340/572.7
6,333,719 B1 12/2001 Varadan et al.
6,630,203 B2 * 10/2003 Bahn et al. .................. 427/304
6,741,221 B2 * 5/2004 Aisenbrey ................... 343/897
6,842,140 B2 1/2005 Killen et al.
6,853,087 B2 * 2/2005 Neuhaus et al. ............. 257/778
6,853,337 B2 2/2005 Barabash (Continued)

OTHER PUBLICATIONS

International Search Report Dated May 10, 2007, International Application No. PCT/US05/31129, International Filing Date: Aug. 31, 2005.

(Continued)

*Primary Examiner*—C. J Arbes

(57) ABSTRACT

Method for making a coupling structure (10) comprises the steps of forming a body (12B) of a polymeric material loaded with a conductive filler, providing a coupling area (12C) of a predetermined shape on a portion of the surface of the body (12S), and attaching a conductive pad (IOP) having a shape corresponding to the shape of the coupling area (12C) in non-penetrating contact with the body (12B).

6 Claims, 4 Drawing Sheets

U.S. PATENT DOCUMENTS

| | | | | |
|---|---|---|---|---|
| 6,940,408 | B2 * | 9/2005 | Ferguson et al. | 340/572.7 |
| 6,953,619 | B2 | 10/2005 | Dean et al. | |
| 6,985,666 | B2 | 1/2006 | Takano | |
| 7,102,520 | B2 * | 9/2006 | Liu et al. | 340/572.1 |
| 7,224,280 | B2 * | 5/2007 | Ferguson et al. | 340/572.7 |
| 2004/0125040 | A1 * | 7/2004 | Ferguson et al. | 343/895 |
| 2005/0001785 | A1 * | 1/2005 | Ferguson et al. | 343/895 |
| 2005/0035924 | A1 * | 2/2005 | Liu et al. | 343/895 |

OTHER PUBLICATIONS

International Search Report Dated Apr. 26, 2006, International Application No. PCT/US05/31130, International Filing Date: Aug. 31, 2005.

International Search Report Dated Mar. 30, 2006, International Application No. PCT/US05/31128, International Filing Date: Aug. 31, 2005.

* cited by examiner

METHOD FOR MAKING A RADIO FREQUENCY COUPLING STRUCTURE

CROSS-REFERENCE TO RELATED APPLICATION

This application claims priority under 35 U.S.C. §119 from U.S. Provisional Application Ser. No. 60/607,182, filed Sep. 2, 2004.

DESCRIPTION OF RELATED ART

Thermoplastic compositions loaded with conductive materials (powders or fibers) are known. The conductive polymeric composition described in copending application titled "Conductive Thermoplastic Compositions and Antennas Thereof", Ser. No. 10/767,919, filed Jan. 29, 2004 (AD-6952), assigned to the assignee of the present invention, is representative of such a thermoplastic composition. Such compositions are good electrical conductors at radio frequencies higher than about one hundred megaHertz (100 MHz).

It is known to use such a conductive polymeric composition to form passive elements, such as a shielded housing or an antenna. U.S. Pat. No. 6,741,221 (Aisenbrey) is representative of such technology.

For example, when an antenna is formed from such a conductive polymeric composition it common practice to insert or embed a metallic element into the body of the antenna in order to attach mechanically and connect electrically to the component with which it used. FIG. 1 shows a body A made of a conductive polymeric composition formed into the shape of an antenna (only a portion of which is suggested in the Figure). A connecting element C penetrates into the body A and serves as an attachment for a wire W which interconnects the antenna with a device D, such as a receiver or transmitter.

The insertion of the metallic connecting element C into the body A is typically accomplished by drilling a bore and threading a metallic element, such as a screw, thereinto. Alternately, the metallic element C may be embedded into the body A by positioning the metallic element in a mold and injecting the conductive polymeric composition around it. Both methods involve an additional step to achieve penetratiori of the metallic element into the body. This increases the cost and complexity of manufacture.

In view of the foregoing it is believed advantageous to provide a method for fabricating a coupling structure for electrically connecting an antenna or other passive element made of a conductive polymeric composition structure with an associated component in a non-penetrating manner.

SUMMARY OF THE INVENTION

The present invention is directed to a method for making a coupling structure for coupling a device operable at a radio frequency with a passive element. The method includes the steps of:

a) forming a body of passive element, such as an antenna, from a polymeric material loaded with a conductive filler;

b) providing a coupling area of a predetermined shape on a portion of the surface; and c) attaching a conductive pad having a shape corresponding to the shape of the coupling area in non-penetrating contact with the body.

When formed the body of a polymeric material may have a region near the surface having a lower concentration of conductive filler material than the concentration in the remainder of the body. Accordingly, to provide a coupling area it may be necessary to remove the surface region with the lower concentration of conductive filler material. The removal may be performed by grinding, machining, etching or laser ablating.

The attaching step may be implemented using an adhesive or a biasing member to urge the conductive pad against the coupling area. Alternatively, the conductive pad may take the form of a metallization layer formed over the coupling area.

BRIEF DESCRIPTION OF THE DRAWINGS

The invention will be more fully understood from the following detailed description taken in connection with the accompanying drawings, which form a part of this application and in which.

DETAILED DESCRIPTION OF THE INVENTION

Figure 1:
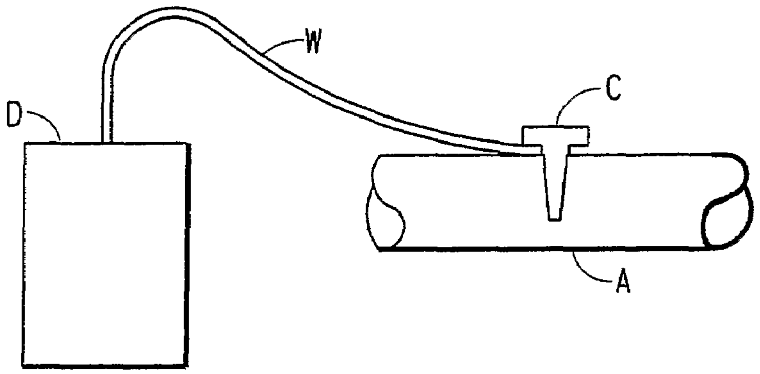
FIG. 1 (Prior Art)
FIG. 1 shows a prior art penetrating connection arrangement.

Throughout the following detailed description similar reference characters refer to similar elements in all figures of the drawings.

Figure 2:
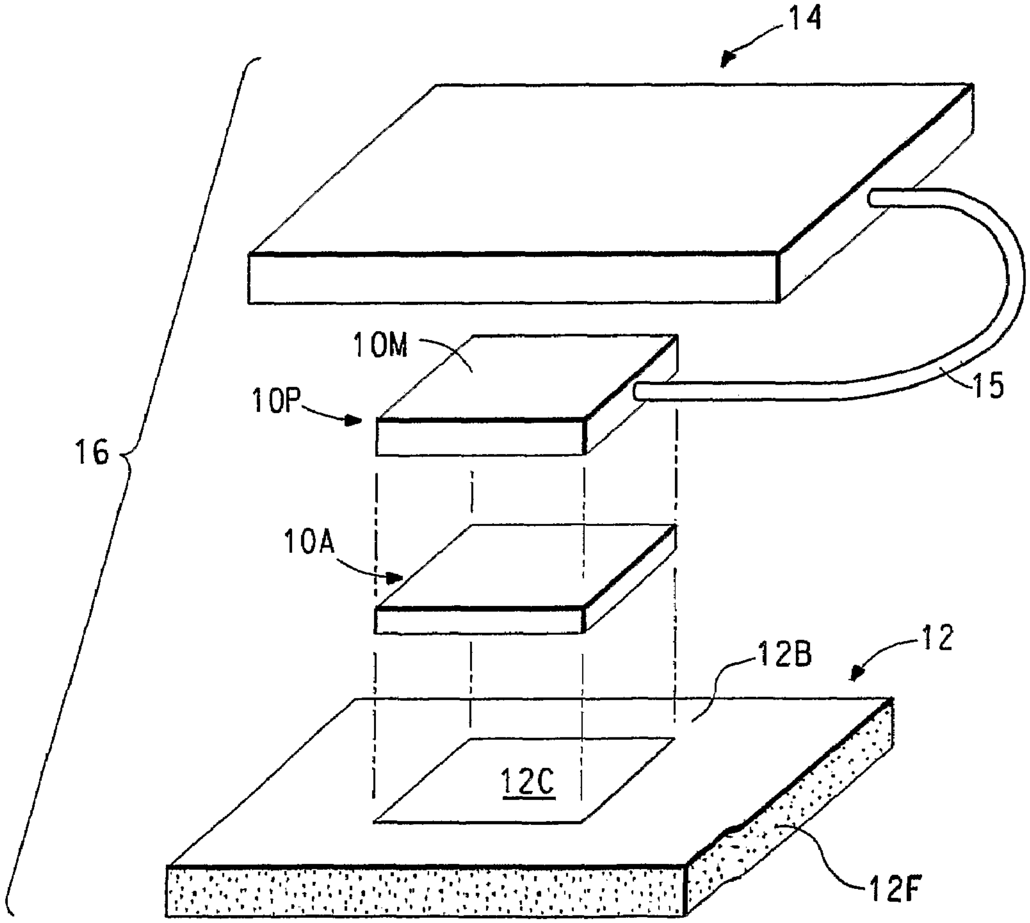
FIG. 2 is an exploded perspective view generally showing a first embodiment of a coupling structure in accordance with the present invention.

With reference to FIG. 2 shown is an exploded perspective view illustrating a coupling structure indicated by reference character 10 generally in accordance with the present invention for coupling a passive element 12 to an electronic device 14 over a suitable conductive linkage 15. In the embodiment of FIG. 2 the conductive linkage 15 is effected using a metallic wire or ribbon conductor.

The overall combination of the passive element 12 coupled by the coupling structure 10 to the electronic device 14 forms a useful electronic system 16. In such a system 16 the conductive polymeric passive element 12 can be used for any of a variety of functions, such as an antenna, a transmission line, a housing, or a component of a sensor assembly. The electronic device 14 may be any of a variety of devices operable at an operating frequency in the radio frequency range. Typical examples of an electronic device 14 include a cellular telephone, a two-way radio, a pager receiver, or a GPS receiver. All of these devices typically operate in the VHF, UHF or microwave portion of the radio frequency spectrum, that is, frequencies in the range above thirty megaHertz to three gigaHertz (30 MHz to 3 GHz) and above.

The passive element 12 is defined by a body 12B formed of a composite polymeric material loaded with a conductive filler 12F. The filler 12F is denoted in FIG. 2 by stipling. The body 12B may exhibit any desired shape consistent with the use to which it is employed in conjunction with the device 14. The body 12B has an impedance associated therewith at the operating frequency.

A predetermined portion of the surface 12S of the body 12B defines a coupling area 12C. The coupling area 12C is that portion of the surface 12S that receives the coupling structure 10 of the present invention. For operating frequencies in the range from about one hundred megaHertz to one gigaHertz (100 MHz to 1 GHz) the coupling area 12C occupies an area about at least ten percent (10%) of the surface 12S of the body 12B. Other operating frequencies mandate a different magnitude of the coupling area 12C.

The coupling structure 10 comprises a conductive pad 10P positioned on the surface 12S of the body 12B in non-penetrating contact therewith. The conductive pad 10P has a shape and area corresponding to the predetermined shape of the coupling area 12C.

In the embodiment of the invention shown in FIG. 2 the conductive pad 10P takes the form of a discrete member 10M made from any conductive metal or composite polymeric material. The pad 10P is attached to the surface of the body 12B using a layer 10A of an adhesive material. The adhesive is a dielectric material that may include a conductive substance in either flake, fiber, or particle form.

Figure 3A:
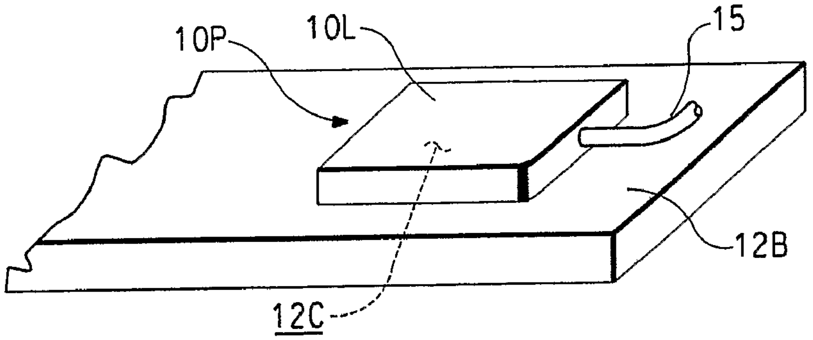
FIGS. 3A, 3B and 3C are sectional elevation views of alternate embodiments of the coupling structure of the present invention.

In some instances the use of an adhesive may be undesirable. Accordingly, as illustrated in FIG. 3A, the conductive pad 10P may be realized by a metallization layer 10L deposited directly to the coupling area 12C. The metallization layer 10L forming the pad 10P may be deposited by any well-known techniques such as electro-deposition, vapor deposition or sputtering.

Figure 3B:
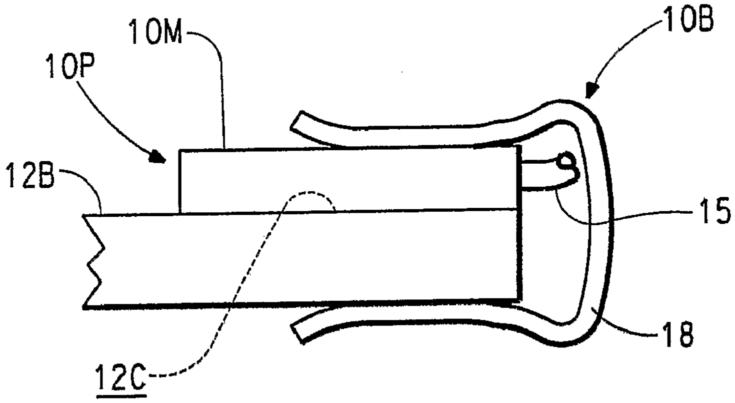

The use of an adhesive may also be avoided by employing a biasing element 10B to bias the conductive pad 10P into contact with the coupling area 12C on the surface 12S of the body 12B. In FIG. 3B the biasing element 10B is specifically implemented in the form of a spring clip 18 affixed to the body 12B. The clip 18 directly abuts against the pad 10P to urge the same into contact with coupling area 12C.

Figure 3C:
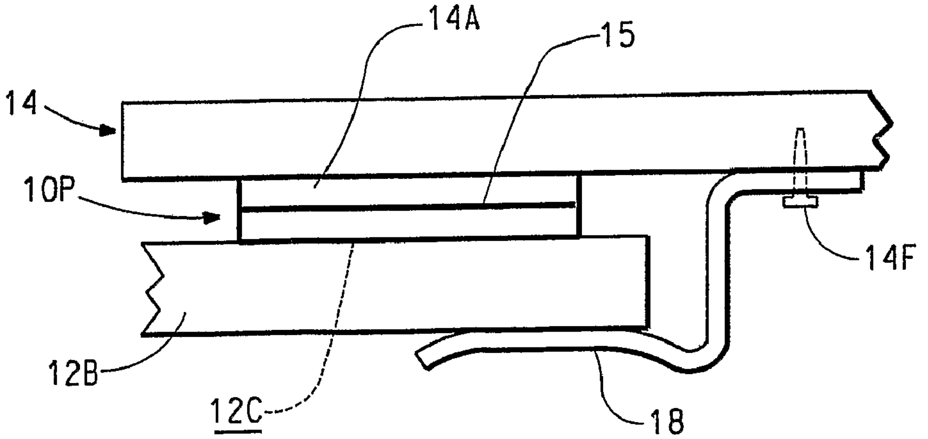

In an alternative embodiment shown in FIG. 3C the spring clip 18 does not contact the pad 10P but instead is disposed so as to physically abut against the body 12B. The clip 18 is attached to the device 14 in any suitable manner, as suggested by the fastener 14F. The biasing action of the clip 18 acts through the body 12B to urge the pad 10P into contact with both the coupling area 12C on the passive element 12 and with a corresponding coupling abutment 14A on the device 14. In this arrangement the conductive linkage 15 between the pad and the device is effected by the physical contact between the pad 10P and the coupling element 14E, thereby obviating the need for a separate wire or ribbon.

FIGS. 4A through 4D are diagrammatic illustrations of the method steps involved in making the coupling structure 10 described above.

As a first step the body 12B of the passive element 12 is formed from a polymeric material loaded with a conductive filler. The body 12B is preferably made from the conductive polymeric material disclosed and claimed in copending application titled "Conductive Thermoplastic Compositions and Antennas Thereof", Ser. No. 10/767,919, filed Jan. 29, 2004 (AD-6952), assigned to the assignee of the present invention. The body 12B is formed into its desired shape by a molding or extrusion process.

The formation process preferably includes the provision of a coupling area 12C of a predetermined shape on a portion of the surface 12B.

Figure 4A:
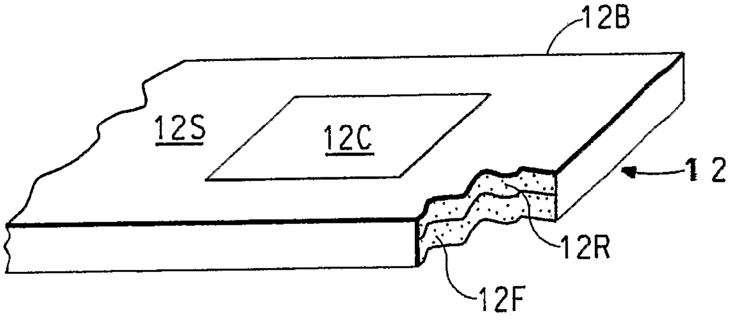
FIGS. 4A through 4D are diagrammatic illustrations of the manufacturing steps involved in making the coupling structure 10 in accordance with the present invention.
Figure 4B:
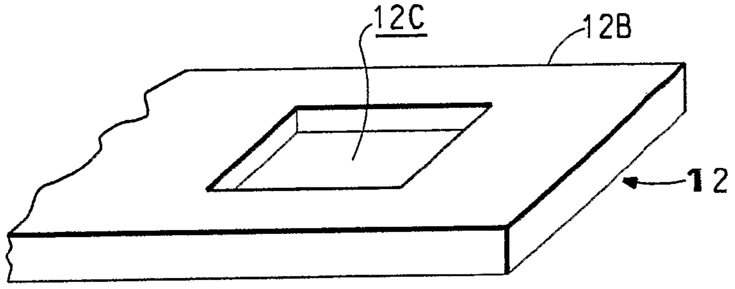

However, as suggested in FIG. 4A, in some instances the formation step may produce a region 12R adjacent the surface 12S. Within the region 12R the concentration of conductive filler material 12F is lower than the concentration present in the remainder of the body 12B. Accordingly, if such a region 12R is present, as an optional next step the surface 12B of the body is prepared by any of a variety of methods to provide the coupling area 12C of a predetermined shape on a portion thereof. This is suggested as a recess in FIG. 4B. Suitable preparation methods include machining, grinding, chemical or electrical etching, or laser ablating. This step prepares the coupling area 12C by removing at least some part of the lower concentration region 12R to expose a region in the body 12B having a greater concentration of conductive filler material.

Figure 4C:
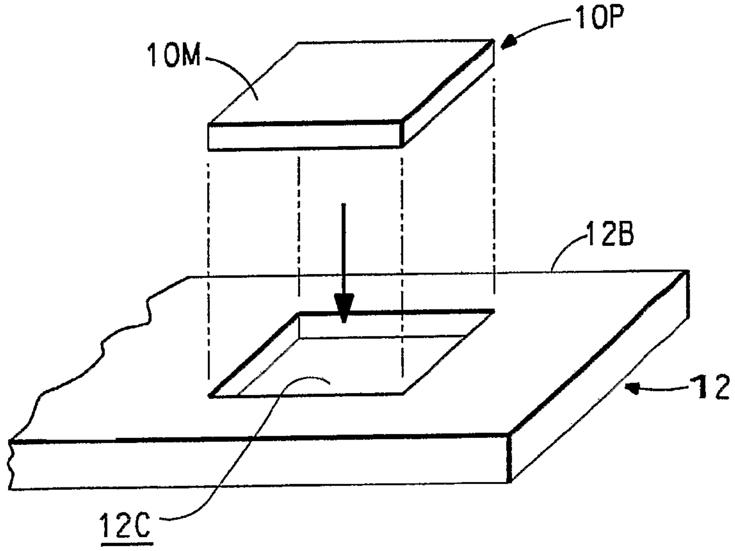
Figure 4D:
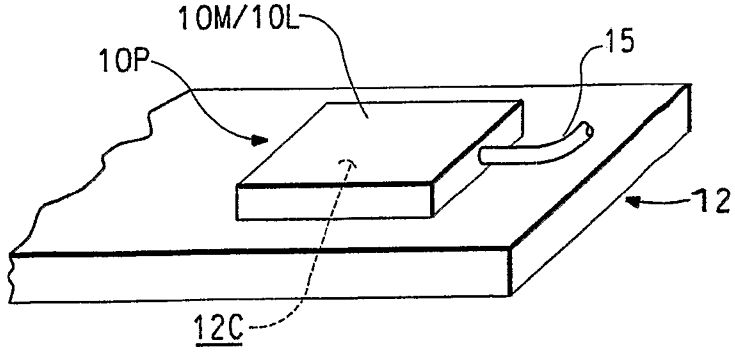

As seen from FIG. 4C the conductive pad 10P in the form of the discrete member 10M having a shape corresponding to the shape of the coupling area 12C is then positioned over the coupling area 12C as so prepared. The conductive pad 10P is then attached in non-penetrating contact to coupling area 12C. The conductive pad 10P may be attached using the adhesive 10A (FIG. 2) or using the biasing member 10B (FIGS. 3B and 3C). Alternatively, if the pad 10P takes the form of the metallization 10L (FIG. 3A) it is positioned and attached to the coupling area 12C in an manner consistent therewith.

Thereafter the device 14 is electrically connected to the conductive pad 10P by the conductive linkage 15, as described above (FIG. 4D).

In use, at the operating frequency, the pad 10P and the body 12B have an impedance defined therebetween that is less than the impedance of the body 12B at the operating frequency, thus facilitating the transfer of electromagnetic energy at the operating radio frequency between the body and the pad. The passive element including the body is a monopole antenna, this impedance is typically about seventy-five ohms (75 Ω).

In accordance with the present invention, because the pad is positioned on the surface of the body in non-penetrating contact therewith, this impedance is substantially capacitively reactive in nature. If, however, an adhesive 12A containing a conductive material is present, the impedance also contains a resistive component in parallel with the capacitive reactance component. The presence of the resistive component tends to reduce the overall impedance presented by the coupling, but does not alter its substantially capacitive nature.

EXAMPLE

A monopole receiving antenna having a body 12B was made of a thermoplastic composition comprising Surlyn® ionomer resin available from E. I. du Pont de Nemours and Company, Inc., Wilmington, Del. filled with forty percent (40%) stainless steel fibers. The fibers averaged about three millimeters (3 mm) in length. The DC conductivity of the monopole receiving was measured to be six thousand five hundred Siemens per meter (6500 S/m). The dimensions of the monopole antenna were: length 2.5 inches (6.35 cm), width was 0.5 inches (1.27 cm) and thickness 0.1125 inches (0.286 cm). The impedance of the monopole receiving antenna is known to be approximately seventy-five ohms (75 D) at the operating frequency of one gigaHertz.

Figure 5:
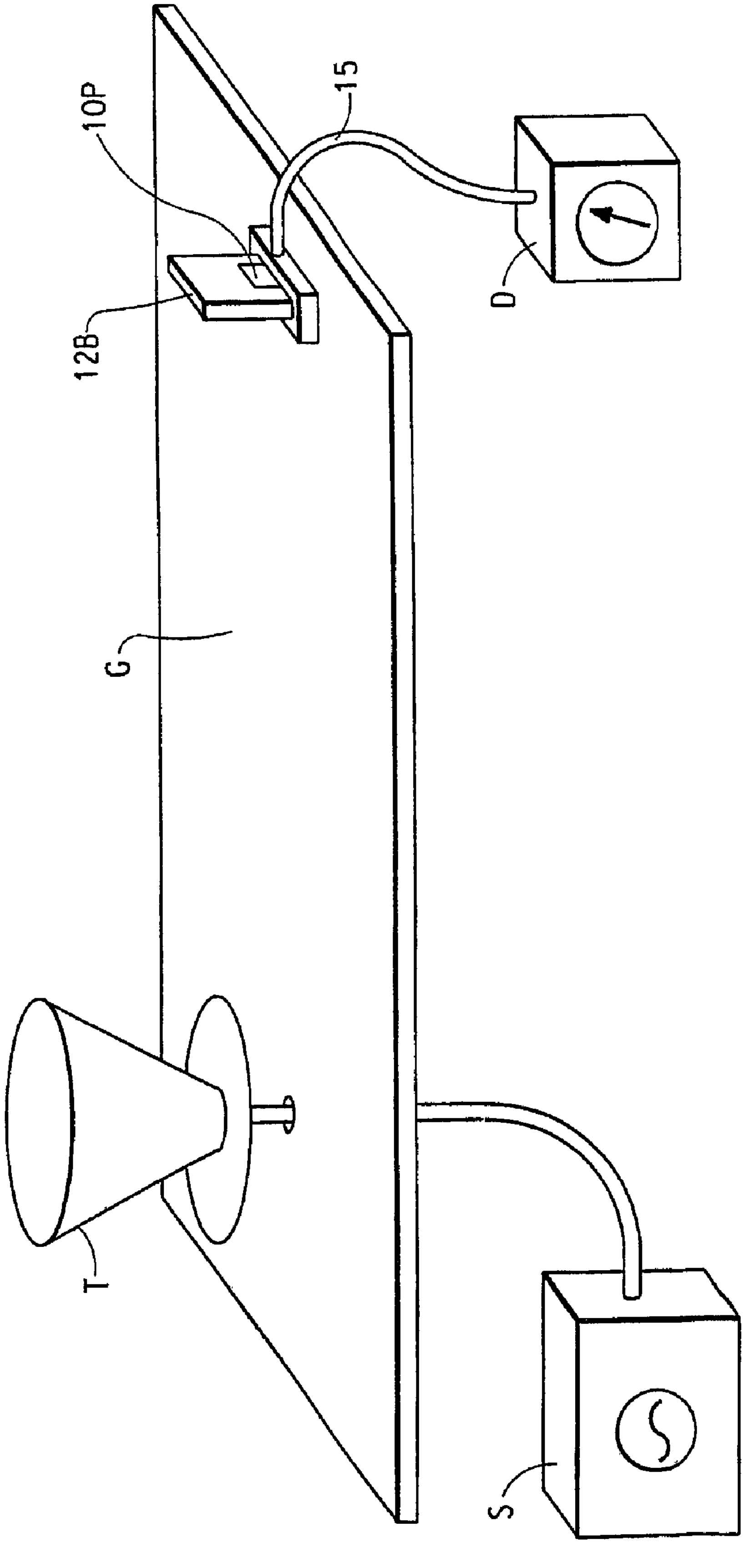
FIG. 5 is a diagrammatic view of a test arrangement used in the Example.

The monopole receiving was mounted on a ground plane G as shown in FIG. 5. The ground plane G was formed of a copper sheet 0.1 inches (0.25 cm) thick and about thirty inches (30 in., 76 cm) in length and twelve inches (12 in, 33 cm) in width.

A standard transmitting antenna T, available from Polarad Corporation as broadband antenna Model CA-B, was positioned on the ground plane G about twenty-four inches (24 in., 57 cm) from the monopole antenna 12B. A radio frequency operating signal of one gigaHertz (1 GHz) was used for all tests. The operating signal was provided to the standard antenna T from a signal source S available from Hewlett Packard as Model HP8647A.

A signal detector D was connected to the monopole receiving antennas used for all tests by a coaxial cable serving as a conductive lead 15. The signal detector D was implemented using a Model 4300 Power Meter available from a Boonton Corporation. The signal detector D was used to measure the signal amplitude from the monopole receiving antenna 12B.

Two reference monopole receiving antennas (Reference 1 and Reference 2 in the Table below) were fabricated using prior art techniques. A first metal reference antenna was fabricated from a solid block of copper. The conductive lead 15 was directly attached to the first copper reference antenna using solder. A second reference antenna was fabricated from the stainless steel, fiber-filled ionomer resin described above. Attachment of the conductive lead 15 to the second reference antenna was made using the prior art method of driving a appropriately sized sheet metal screw into one end of the reference antenna.

Four monopole test receiving antennas (Test Antenna A through Test Antenna D in the Table below), each fabricated from the stainless steel fiber-filled ionomer resin described above. These four monopole test receiving antennas were coupled to the signal detector D using a coupling structure embodying the present invention.

In each instance the pad 10P of the coupling structure was formed from an adhesive-coated copper tape having a thickness of 0.003 inch (0.076 mm) attached in a non-penetrating manner to the antenna body. However, the conductive pad 10P for each of the four test receiving antennas had a different area. The pad for Test Antenna A had an area of 0.5 square inches (3.23 square cm). The pad for Test Antenna B had an area of 0.4 square inches (2.58 square cm). The pad for Test Antenna C had an area of 0.25 square inches (1.62 square cm). The pad for Test Antenna D had an area of 0.1 square inches (0.65 square cm).

The measured results from the tests are set forth in the Table below. The attenuation values set forth were measured values. Calculated impedance values for Test Antenna A through Test Antenna D are shown in the right hand column.

TABLE

| Sample/Contact | Attenuation db @ 1 GHz | Attenuation db vs. Copper | Impedance between pad and antenna ohms |
|---|---|---|---|
| Prior Art Reference 1 | | | |
| copper block solder attachment | −21.42 | 0.00 | |
| Prior Art Reference 2 | | | |
| Thermoplastic antenna With screw attachment | −21.67 | −0.25 | |
| Test Antenna A | | | |
| Copper foil Pad area 0.5 sq. inch | −21.55 | −0.13 | 13.0 |
| Test Antenna B | | | |
| Copper foil Pad area 0.4 sq. inch | −21.57 | −0.15 | 15.6 |
| Test Antenna C | | | |
| Copper foil Pad area 0.25 sq. inch | −21.52 | −0.10 | 25.9 |
| Test Antenna D | | | |
| Copper foil Pad area 0.1 sq. inch | −22.82 | −1.40 | 66.0 |

Discussion The measured attenuation of Test Antennas A-D, which employed the coupling structure of the present invention, compared favorably to Prior Art References 1 and 2. The measured attenuation of Test Antenna D, which had the smallest area pad 10P, performed with an attenuation of only 1.40 db more than the Prior Art Reference 1.

These examples demonstrate that the coupling structure of the present invention facilitates the transfer of electromagnetic energy at the operating radio frequency between the body and the pad.

Recalling that the impedance of the monopole receiving antenna is known to be approximately seventy-five ohms (75 Ω) at the operating frequency of one gigahertz, it may be seen from the calculated values shown in the right hand column that the impedance between the pad and the antenna body is less than the impedance of the antenna body.

-o-O-o-

Those skilled in the art, having the benefit of the teachings of the present invention may impart numerous modifications thereto. Such modifications are to be construed as lying within the contemplation of the present invention, as defined by the appended claims.

What is claimed is:

1. A method for making a coupling structure comprising the steps of:

a) forming a body of a polymeric material loaded with a conductive filler, the body having a surface;

b) providing a coupling area of a predetermined shape on a portion of the surface; and c) attaching a conductive pad having a shape corresponding to the shape of the coupling area in non-penetrating contact with the body, the attaching step including the use of a resilient biasing member to urge the conductive pad against the coupling area.

2. The method of claim 1 wherein the attaching step c) comprises the step of:

adhering the conductive pad to the coupling area.

3. The method of claim 2 wherein the adhering step is performed using an adhesive.

4. The method of claim 3 wherein the adhesive is a dielectric material.

5. The method of claim 3 wherein the adhesive includes a conductive material.

6. The method of claim 1 wherein the attaching step c) comprises the step of:

forming a metallization layer over the coupling area.

* * * * *